United States Patent [19]

Geren, deceased et al.

[11] Patent Number: 4,466,766
[45] Date of Patent: Aug. 21, 1984

[54] TRANSFER APPARATUS

[75] Inventors: Lorenzo D. Geren, deceased, late of Houston, Tex., by Henrietta C. Geren, administratrix; Raymond D. Worden, Houston, Tex.

[73] Assignee: Ruska Instrument Corporation, Houston, Tex.

[21] Appl. No.: 497,544

[22] Filed: May 24, 1983

Related U.S. Application Data

[63] Continuation of Ser. No. 265,633, May 20, 1981, abandoned.

[51] Int. Cl.³ .............................................. B65B 5/08
[52] U.S. Cl. .................................. 414/404; 294/87 R; 414/225; 414/750
[58] Field of Search ............... 414/404, 405, 409, 416, 414/422, 225, 589, 749, 750.2; 294/67 BB, 87 R, 103

[56] References Cited

U.S. PATENT DOCUMENTS

| | | | |
|---|---|---|---|
| 3,841,689 | 10/1974 | Hurlbrink | 294/87 R |
| 3,934,733 | 1/1976 | Worden | 414/405 |
| 3,949,891 | 4/1976 | Butler et al. | 414/405 |
| 4,208,159 | 6/1980 | Uehara et al. | 414/404 |
| 4,244,673 | 1/1981 | Henderson | 414/405 |
| 4,299,532 | 11/1981 | Bouwmeester | 414/750 |

Primary Examiner—Robert B. Reeves
Assistant Examiner—Donald Hajec
Attorney, Agent, or Firm—Vinson & Elkins

[57] ABSTRACT

An apparatus for transferring wafers between a process carrier and a furnace carrier. The apparatus lifts a plurality of wafers from one carrier and deposits them into another carrier without damage to the wafers or touching any more than the edge surfaces and adjacent areas of the wafers.

11 Claims, 14 Drawing Figures

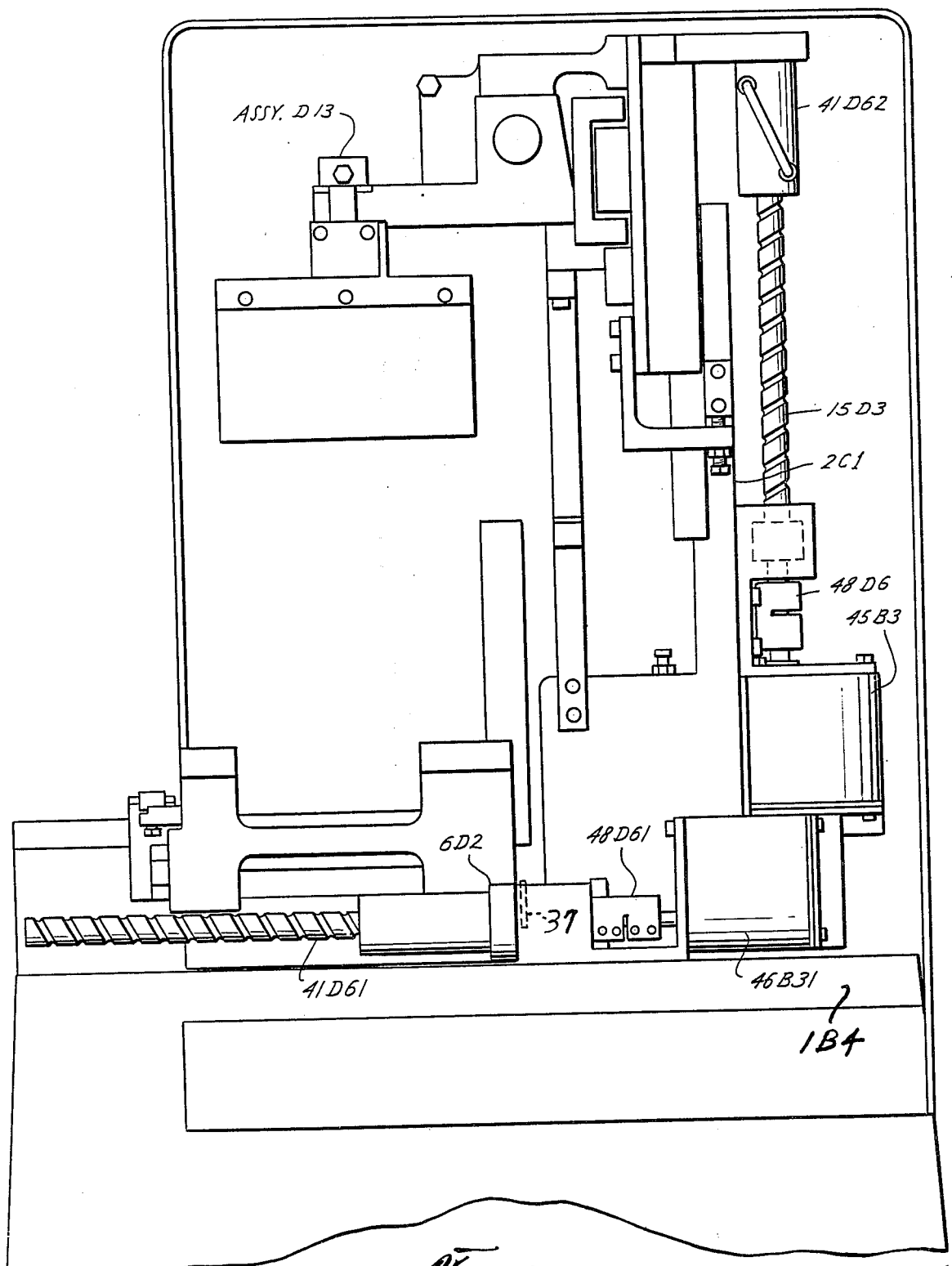

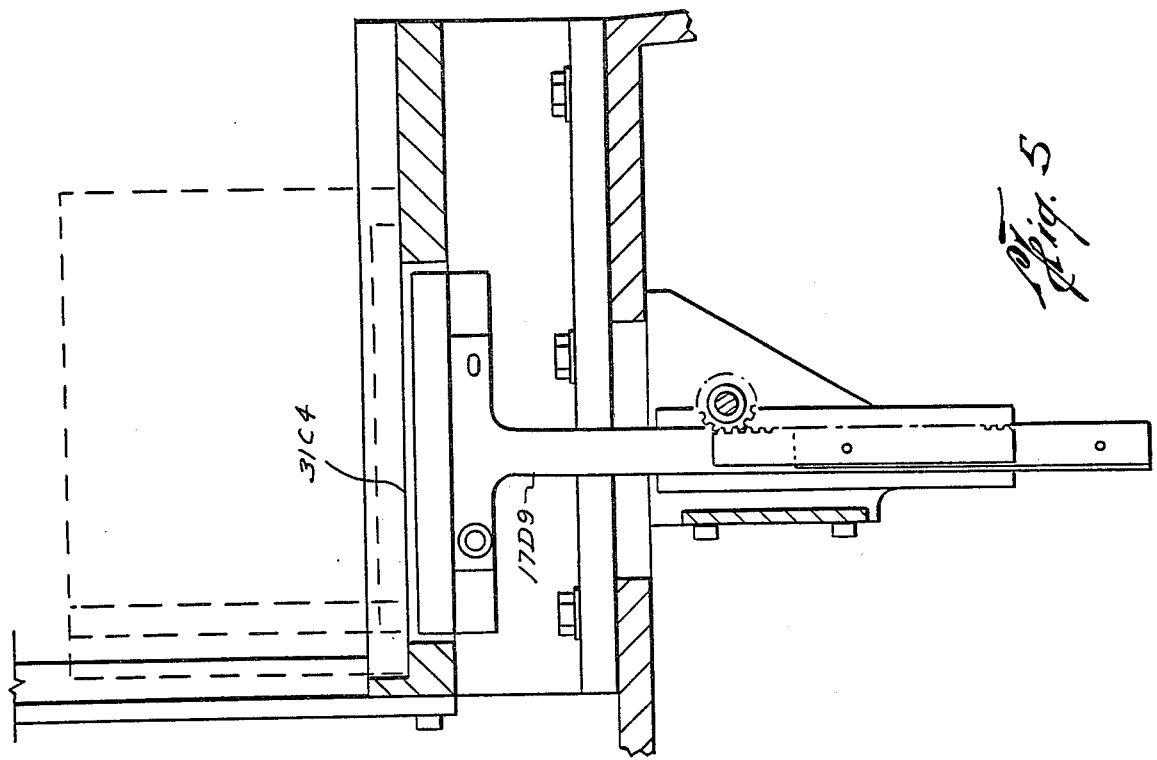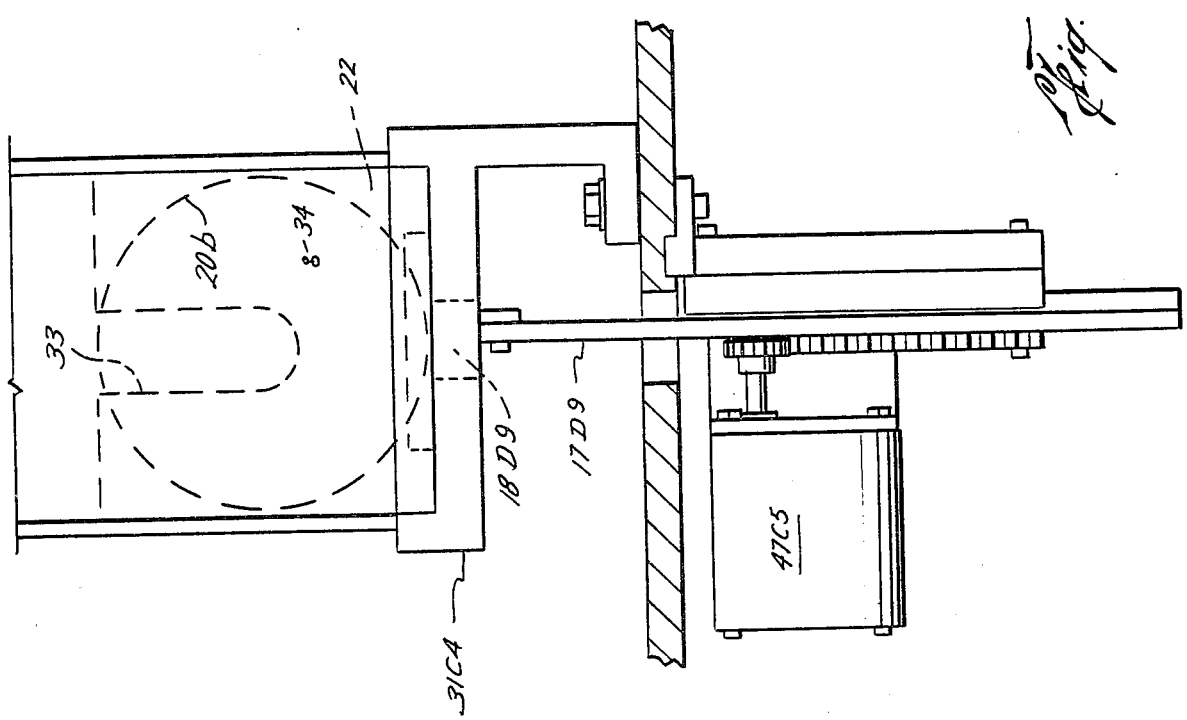

TRANSFER APPARATUS

This application is a continuation of our copending application Ser. No. 06/265,633, filed May 20, 1981, now abandoned.

This invention relates to devices for transferring wafers between process carriers and furnace carriers.

In the past wafers have been transferred between process and furnace carriers. In the beginning they were transferred by hand, by mating two carriers and inverting them to dump wafers from one carrier into another. In the prior procedures it was possible to dump twenty-five wafers from a furnace carrier into a process carrier and then dump another twenty-five wafers which will alternate the position relative to the first twenty-five into a second process carrier. In other words, every other wafer was dumped into the two separate process carriers. A transfer adapter was used for this purpose, see U.S. Pat. Nos. 3,934,733 and 3,949,891. Most of the prior art devices have worked on the principle of inverting the carriers, frequently with intermediate equipment between the two carriers to prevent half of the wafers from passing through to the transfer carrier. In the rotation of the devices small particles are generated due to rolling of the wafers which is undesirable. Also many of the inversion type devices result in damage to the wafers. Where these devices have been automated they have been very large and bulky devices or unreliable.

It is the object of this invention to provide a transfer device in which the wafers are not rolled or moved about their central axis in any way during transfer between two carriers.

Another object is to provide a wafer transfer device in which there is a minimum of moving contact between the wafers and the transfer device to greatly reduce or eliminate any damage to the wafers or generation of particles or the like which would contaminate the wafers.

Another object is to provide a transfer apparatus in which all of the wafers being transferred may maintain a given orientation while being transferred.

Another object is to provide a transfer apparatus which may readily transfer either its entire capacity or any number of wafers less than its entire capacity.

Another object is to provide a transfer apparatus which is reliable and has a very small instance of jamming or non-transfer of one or more wafers.

Another object is to provide a transfer apparatus which can accommodate various designs of wafer carriers.

Another object is to provide a transfer apparatus wherein only one mode of power such as electrical power is required to operate the transfer device.

Other objects, features and advantages of the invention will be apparent from the drawings, the specification and the claims.

In the drawings wherein like reference numerals indicate like parts and wherein an illustrative embodiment of this invention is shown:

FIG. 3 is a view in side elevation of the apparatus;

FIG. 4 is a front elevational view of the wafer lifter showing the wafer in dashed lines in the position it would occupy in a carrier in the machine before being lifted;

FIG. 5 is a side view of the wafer lifter showing the wafer in dashed lines in the position it would occupy in a carrier in the machine before being lifted.

Figure 1:
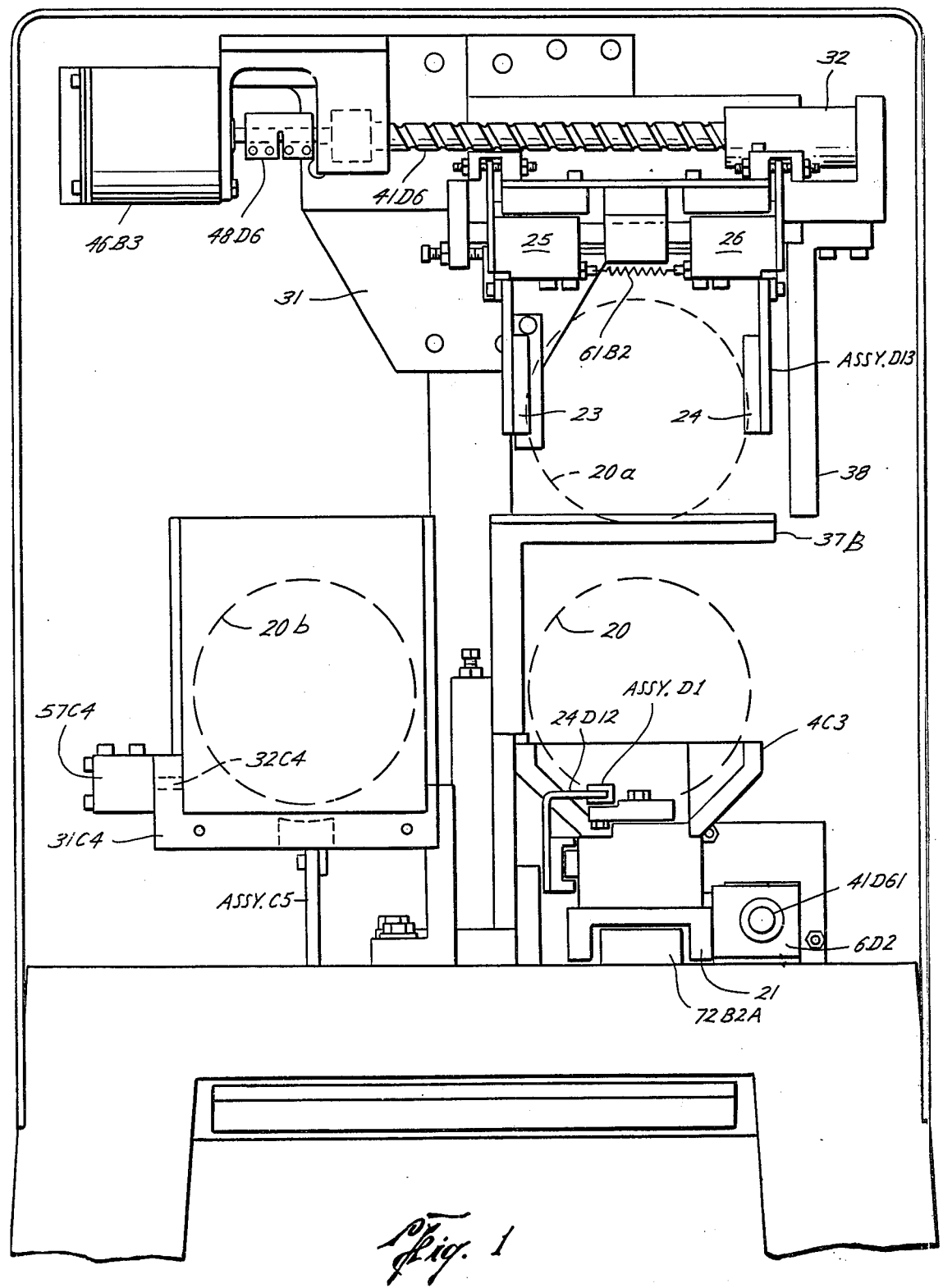
FIG. 1 is a front elevational view of the transfer apparatus showing in dashed lines at three different positions the wafer position when in the two carriers, which are not shown, and when in transit between the two carriers.
Figure 2:
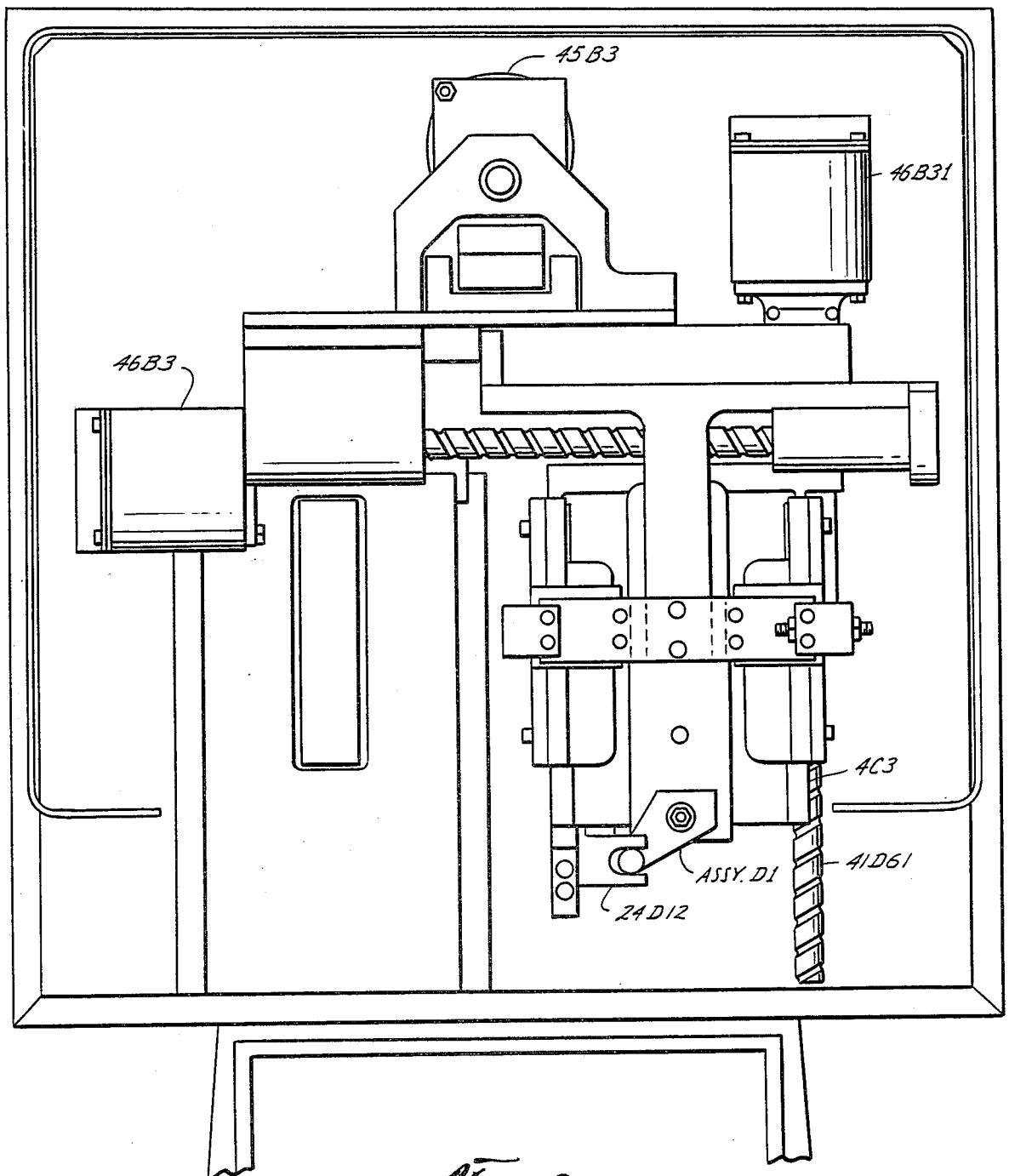
FIG. 2 is a top plan view of the transfer apparatus.

Referring particularly to FIGS. 1, 2, and 3 the apparatus is designed to automatically transfer a plurality of wafers from the position shown in dashed lines at 20 in FIG. 1 through the position shown at 20a to the final position shown at 20b.

Figure 12:
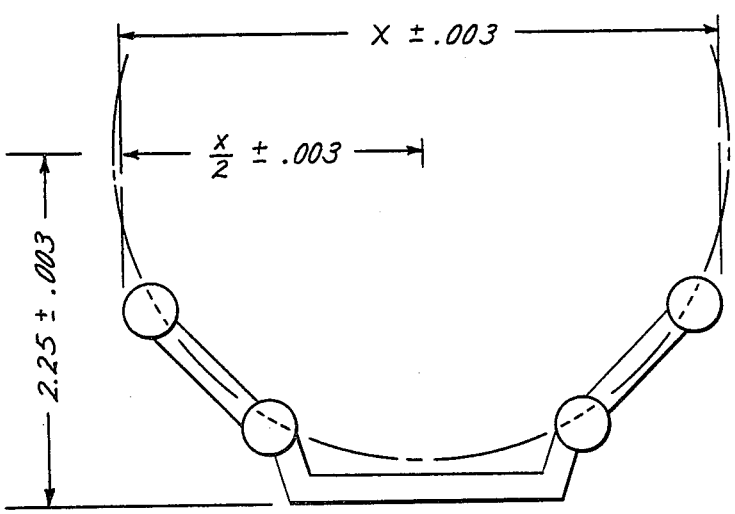
FIG. 12 is an end view of a furnace boat.
Figure 13:
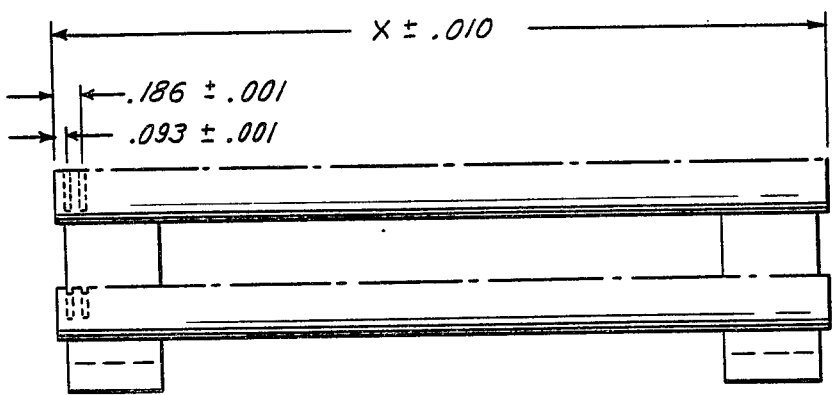
FIG. 13 is a side view of the furnace boat of FIG. 12.

The wafer in the position shown at 20 will be supported in a furnace boat such as shown in FIGS. 12 and 13.

Considering the structure generally, the wafer in its position at 20 is carried in the furnace boat in a furnace boat platform 4-C3. This platform is reciprocal and moves from a loading position towards the front of the machine in which a boat may be readily inserted and removed to a position where the furnace boat slots are lined up with the slots in the process carrier. At this time the wafer carrier indicated as ASSY/D-13 lowers to a position in which it engages the several wafers and then raises to the position that is shown at 20a to completely clear the wafers from the furnace boat.

After the transfer assembly has moved to its raised position it is then moved to the left of FIG. 1 to a position overlying the process boat which carries the wafer, as shown in dashed lines at 20b. A typical process boat is shown in U.S. Pat. No. 3,934,733.

When the carrier is positioned immediately above the process boat the carrier moves downwardly to position the wafers within and slightly raised relative to the process boat. At this time a lifting mechanism indicated at ASSYC5 raises through the bottom of the process boat and supports the several wafers thereon. After the wafers are supported the transfer device moves to open position to release the wafers and thereafter moves upwardly and returns to its original position. Simultaneously, the lifting mechanism ASSYC5 lowers the wafers to the position shown at 20b and moves into an out of the way position below the process carrier to permit the process carrier to be removed from the machine.

Considering now in detail the support for the furnace carrier, the assembly is oscillated on a fixed track 72-B2A which extends fore and aft of FIG. 1. Reciprocal on the track 72-B2A is the moving slide 21 on which there is mounted the furnace boat platform 4-C3.

With the assembly in its partially retracted position the yoke 24D12 strikes a stop, which is not shown, which limits the movement of the yoke while the carriage moves a slight distance further outwardly from the machine. This causes the arm ASSYD1 to rotate in a clockwise direction and provide room for inserting and removing a furnace boat. As the boat platform moves into the machine the arm ASSYD1 is spring loaded to rotate in a counterclockwise direction to hold the furnace boat in abutment with the forward end of the furnace boat platform to exactly position the furnace boat fore and aft of the furnace boat platform.

The furnace boat platform is reciprocated by the cooperation of screw 41-D61 which rotates within nut 6D2 which is affixed to the moving slide 21. This screw 41-D61 is driven by motor 46-B31 through the slip clutch 48-D61. Thus, the furnace boat platform is moved into the machine as viewed in FIG. 1, until it engages a stop which is not shown, which positions the furnace boat with its slots directly opposite the slots in the process boat which is shown at 22 in FIG. 4. This boat supports the wafer at the position 20b shown in FIG. 1. Thus, with the slots in the furnace boat and the process boat in alignment the several wafers are positioned to be plucked from the furnace boat and transferred to the process boat.

The motor 46-B31 senses a slight overload condition due to the furnace boat platform reaching its full transfer position and signals to the transfer device at ASSYD13 and the entire transfer assembly ASSYD13 is lowered by a current being furnished to motor 45-B3 (FIG. 3), which drives the screw 15-D3 through the slip clutch 48-D6. A nut 41-D6 is carried on the screw and as this nut supports the transfer ASSYD13 the entire assembly is lowered toward the furnace boat.

The transfer assembly includes a pair of opposed wafer carriers 23 and 24. These wafer carriers are supported on a pair of motors, such as solenoids 25 and 26 and the motors and their associated wafer carriers are urged towards each other by the spring 61-B2 which is in tension and exerting a constant force to move the two solenoids to closed position. Prior to the transfer assembly moving downwardly, a signal has been sent to the two solenoids 25 and 26 to extend the solenoids and space the two wafer carriers 23 and 24 apart by a distance which will permit them to move downwardly past the horizontal center line of the wafers.

With the wafer carriers 23 and 24 in their open position the entire assembly moves downwardly until it strikes a stop which positions the wafer carriers 23 and 24 with a portion of the carriers below the horizontal centerline of the wafers and a portion above the horizontal centerline of the wafers, as shown in FIG. 1. As will appear hereinafter, the wafer carriers 23 and 24 have alternate slots. One of the slots is vertical to permit it to readily pass a wafer and the other has an upwardly and outwardly inclined surface which is below the centerline of the wafer and adapted to engage and support the wafer. With the wafer carriers so positioned and the stop engaged, a signal is sent to the solenoids 25 and 26 to deactivate the solenoids and the spring 61-B2 is effective to pull the two wafer carries 23 and 24 toward each other to their closed position at which time the wafers are in alternate slots in the wafer carriers and are supported on the ledges in the lower portion of the wafer carriers.

Figure 9:
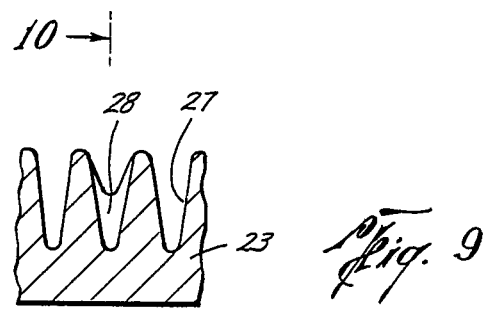
FIG. 9 is a sectional view through a fragment of a wafer lifting plate.

A fragment of the wafer carrier 23 is shown in FIG. 9. It will be noted that every other slot in the wafer carrier is a vertical slot extending through the wafer carrier so that a wafer may freely pass through the slot in any position of the wafer carrier and the wafer carrier will only engage every other wafer in the furnace boat. These vertical slots are shown at 27.

Figure 10:
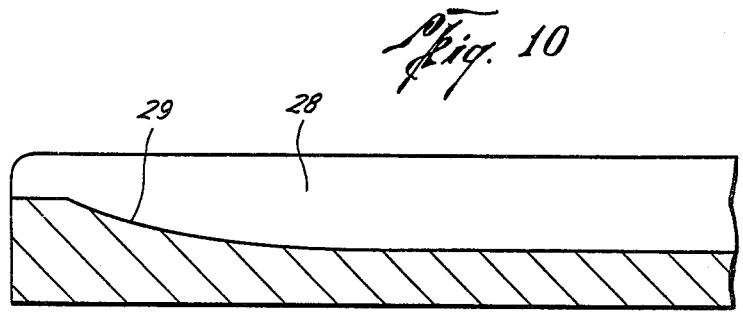
FIG. 10 is a view in section on the lines 10—10 of FIG. 9.

Intermediate each vertical slot 27 there is a wafer supporting slot 28. By reference to FIG. 10 it will be noted that the bottom of slot 28 at the lower section of the wafer has an upwardly and outwardly curved section 29. With the carriers 23 and 24 positioned in their full down position, the section 29 of the carrier will be below the horizontal centerline of the wafers and when the wafer carriers 23 and 24 are moved toward each other these portions 29 of the wafer carriers will engage the wafers and support the wafers on the carriers.

Figure 11:
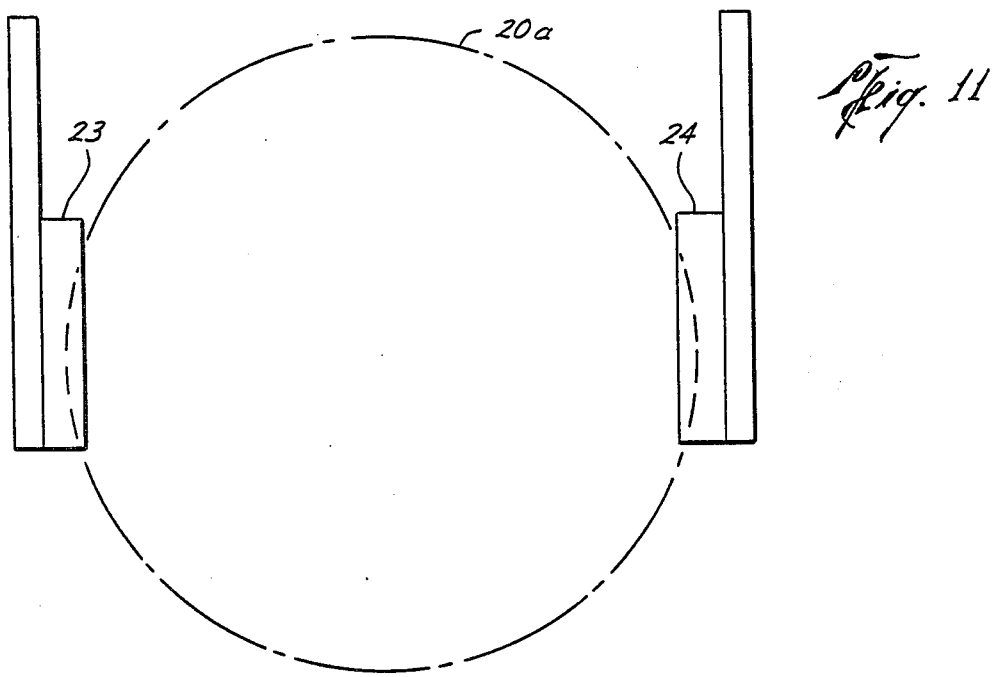
FIG. 11 is a view showing a wafer in dashed lines between two lifting plates.

This support condition is indicated in FIG. 11 in which the wafer shown in position 20a has been engaged by and is supported on the two wafer carriers 23 and 24 and has been lifted from the furnace boat to the position shown in 20a in FIG. 1. Thus, as the wafer carriers 23 and 24 move toward each other in conjunction with a furnace boat carrying fifty wafers the wafer carriers will engage with slope shoulders 29 alternate wafers and when the wafer carriers 23 and 24 are lifted they will extract from the furnace boat every other wafer. The alternate wafers will pass through grooves 27 in the wafer carrier and will remain in the boat.

When the wafer carrier reaches its up position, as shown in FIG. 1, it will strike a stop which will stop further upward movement of the assembly. At this time the overload registered by the lifting motor 45-B3 will signal that the assembly is in the full up position and a signal will be sent to the transfer motor 46-B3.

The wafer carrier system is moved transversely from its position over the furnace boat to the position over the process boat by the motor 46-B3 which drives the screw 41-D6 through the clutch 48-D6. The motor 46-B3 and its associated screw 41-D6 are mounted on the slide assembly 31 which slides on the standard 2-C1 in a vertical direction as the wafer transfer assembly moves vertically, as above explained. The motor 46-B3 and its associated screw, of course, travel vertically as they are mounted on the slide member 31. Thus, with the entire transfer assembly in its uppermost position the actuation of motor 46-B3 in driving screw 41-D6 through the slip clutch 48-D6 will slide the wafer carrier ASSYD13 to the left as viewed in FIG. 1, due to the rotation of screw 41-D6 in the nut 32 until a stop is reached in a position in which the wafers are positioned immediately over the process carrier, that is, immediately above the dashed line showing of the wafer at 20b. Again, a stop causes the motor 46-B3 to sense an overload and signal to the motor 45-B3 which controls vertical movement of the assembly to drive this motor in a direction to lower the wafer carriers 23 and 24 to a position in which they are suspended with the wafers preferably extending into the slots in the wafer carrier, but suspended above the bottom of the process boat.

At this time a signal is sent to motor 47-C5 which through a rack and pinion drives the wafer support 18-D9 carried by standard 17-D9 upwardly until the wafer support engages and lifts the wafers in the wafer carrier a short distance so that they are supported on the wafer support 18-D9. When the standard 17-D9 reaches its full up position and engages a stop to prevent additional movement the motor 47-C5 stalls and signals are then sent to the solenoids 25 and 26 of the transfer device to move the wafer carriers 23 and 24 away from each other to their open position in which they no longer support the wafers.

In response to the wafer carrier solenoids 25 and 26 moving to the open position, a signal is sent to the wafer support motor 47-C5 to drive the wafer support 18-D9 downwardly. The wafer support moves downwardly to a position in which it is below the process carrier which is shown in dashed lines at 33 so that the wafers are supported in the carrier in the position 20b.

As the wafer carrier opens a signal is also sent in response to this opening of the wafer carriers to the vertical carrier motor 45-B3 which raises the entire wafer transfer assembly upwardly again to clear the wafers and the process carrier 33.

The wafer carrier moves to its vertically uppermost position where it again strikes its stop and signals the transverse motor 46-B3 to drive the wafer carrier to the position shown in FIG. 1, which is the neutral position. Upon reaching the neutral position the solenoids 25 and 26 are released and the wafer carriers 23 and 24 are pulled toward each other by the spring 61-B2.

During the return of the assembly to its position shown in FIG. 1 a signal is sent to the drive motor 46-B31 of the furnace boat platform assembly and this motor drives the furnace boat platform to its extended position when the system is programmed to transfer only twenty-five wafers. If the system is programmed to transfer fifty wafers in two successive operations, the furnace boat platform may be left in its position where the grooves in the furnace boat platform are immediately opposite to grooves in the process boat.

Where the system is programmed to transfer fifty wafers from a furnace boat in two steps to processing carriers which only have provisions for twenty-five wafers, indexing must be provided for which will align the second set of wafers with the grooves in the process boat. For this purpose, when the system is programmed to transfer fifty wafers an automatic indexing system is provided.

As a precaution against the system operating without the process carrier in place or the process carrier improperly placed a switch 34 is provided in the back wall of the process carrier platform 31-C4. When the process carrier is supported on the platform, it must be moved all the way to the back and in engagement with the back wall which will properly register the several wafer slots before the system will operate. In moving to this point it will activate the switch 34 which upon initial activation will permit the system to operate.

In order to secure the process boat in the position holding the switch 34 in depressed position, the system is preferably provided with a solenoid 57-C4 shown in FIG. 1 which is activated upon initiation of the start of the system to extend the plunger 32-C4 and engage the process boat and firmly hold it in position.

When it is desired to operate in the mode of transferring in two stages twenty-five wafers each from the furnace boat to two successive process boats the system must be indexed so that the second series of twenty-five wafers is immediately opposite the grooves in the second process boat.

Conveniently, the switch 34 may initiate this operation and after the first transfer has been carried out the removal of the process boat 33 and the insertion of a second process boat 33 will activate the switch for the second time and this second activation will initiate the indexing function.

In accordance with this invention the furnace boat platform is preferably indexed so that it will move approximately half of the spacing of the slots in the process boat. This will be in the neighborhood of one hundred thousandths of an inch in some form of boats and the indexing system will permit the furnace boat platform to move an additional one hundred thousandths of an inch before the second cycle is carried out.

Figure 6:
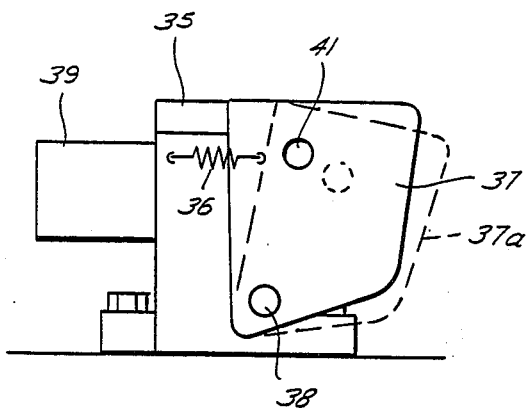
FIG. 6 is a view in elevation of the indexing device in solid lines in one position and in dotted lines in a second position.
Figure 7:
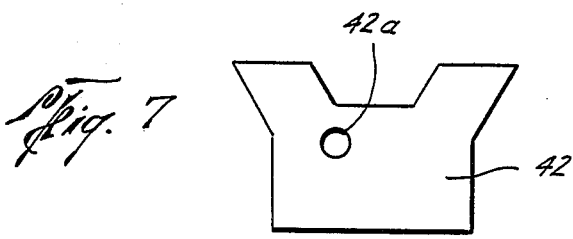
FIG. 7 is a fragment of furnace boat platform showing the receiving hole for indexing pin 41.

Preferably, a simple indexing system such as shown in FIG. 6 is utilized. The index has a projecting surface 35 which overhangs the spring 36 so that the spring 36 will not interfere with the abutment of the furnace boat platform against the surface 35. In one indexing position the furnace boat platform will abut against surface 35 to index the platform.

To provide for the other indexing position a swingable arm 37 is mounted on pivot 38 and is moved between the solid line position shown at 37 and the dotted line position shown at 37a by solenoid 39 and spring 36. The swingable plate 37 is moved to the right of FIG. 6 by solenoid 39 and retracted by the spring 36.

The swingable member 37 carries a pin 41 which projects outwardly and engages the surface 42 of the furnace boat platform in one position of the swingable arm 37 to space the furnace boat platform from the surface 35. This would be the solid line position shown in FIG. 6. When the arm 37 is swung to the right in FIG. 6 by extension of solenoid 39 the pin 41 projects into the hole 42a in the furnace boat platform and permits the platform to continue in its movement into engagement with the surface 35, thus providing for the two positions of the furnace boat platform relative to the process boat.

The indexing system shown in FIG. 6 is carried on the base 1B4 and is positioned as shown in FIG. 3 where the arm 37 is shown in dashed outline.

Thus, when the system is programmed for the fifty wafer dual transfer mode, the activation of the switch 34 the second time will shift the indexing arm 37 to properly index the furnace boat platform for transferring the second set of wafers and the previously described cycle will be repeated to transfer the second set of wafers. When in the fifty mode the furnace boat platform does not return to its load position but remains in the transfer position. The arm 37 swings to its dashed line position in which the pin 41 lines up with the hole 42a and the motor 46-B3 is still turning and will drive the platform to its second index position when the pin 41 is aligned with the hole 42a.

In order to prevent the transfer carriage from moving downwardly unless it is in a position immediately above the furnace boat or the process boat a stop bar 37b is provided which extends transversely of the machine. The travelling carriage carries a downwardly extending member 38 which is spaced to the right of the bar, as shown in FIG. 1, when the travelling carriage is in its extreme right hand position. When the travelling carriage moves to its extreme left position, as viewed in FIG. 1, the stop 38 would be to the left of the safety bar 37b. In the event of a malfunction and the travelling carriage attempting to move downwardly when not properly in register over either the furnace boat or the process boat the stops 37b and 38 will engage each other as the carriage moves down to where the probe or downwardly extending member 38 engages the stop 37b and will prevent further downward movement of the travelling carriage, thus protecting the wafers against damage.

Figure 8A:
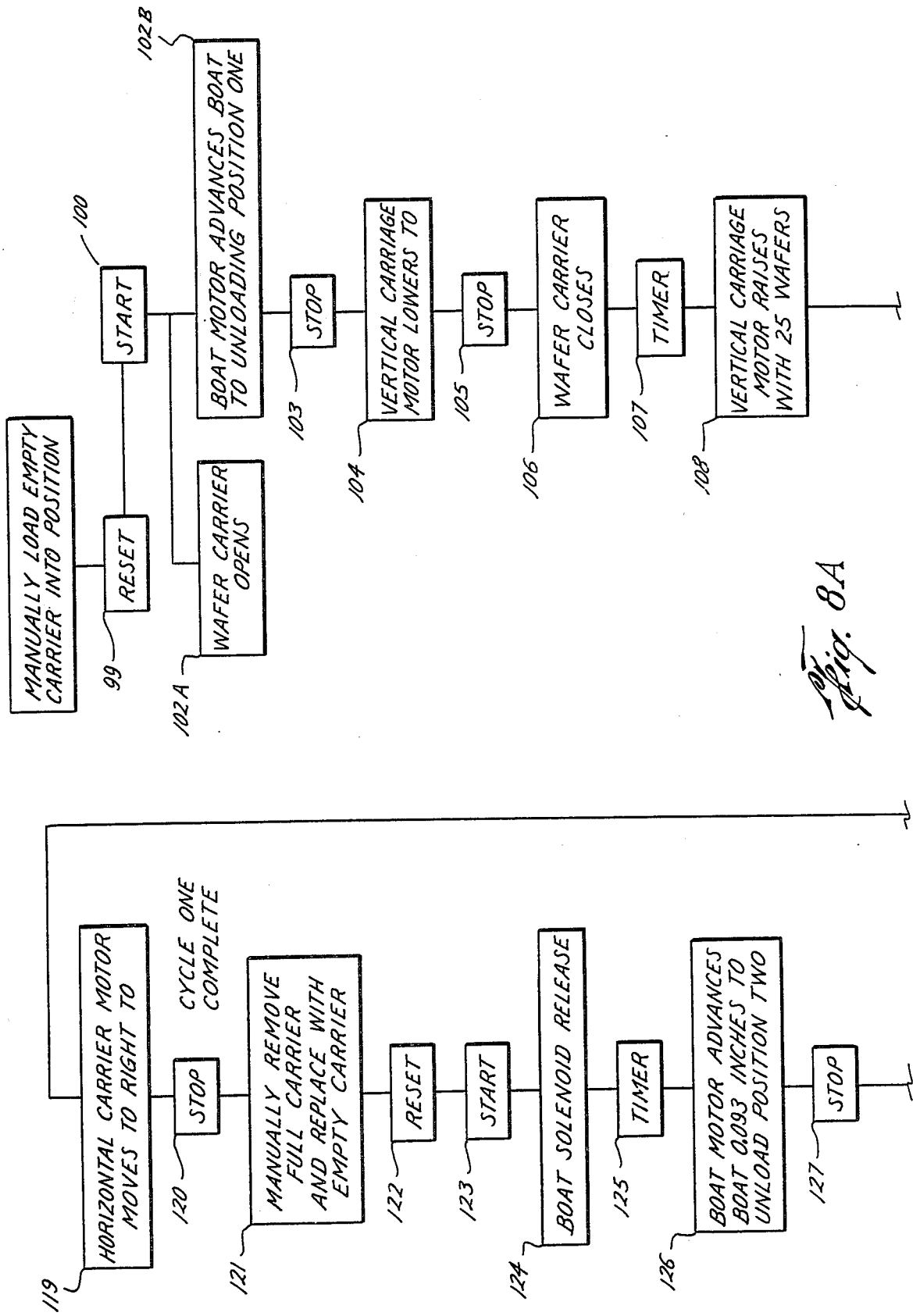
FIGS. 8A and 8B are schematic continuation views illustrating the operational sequence of the device.
Figure 8B:
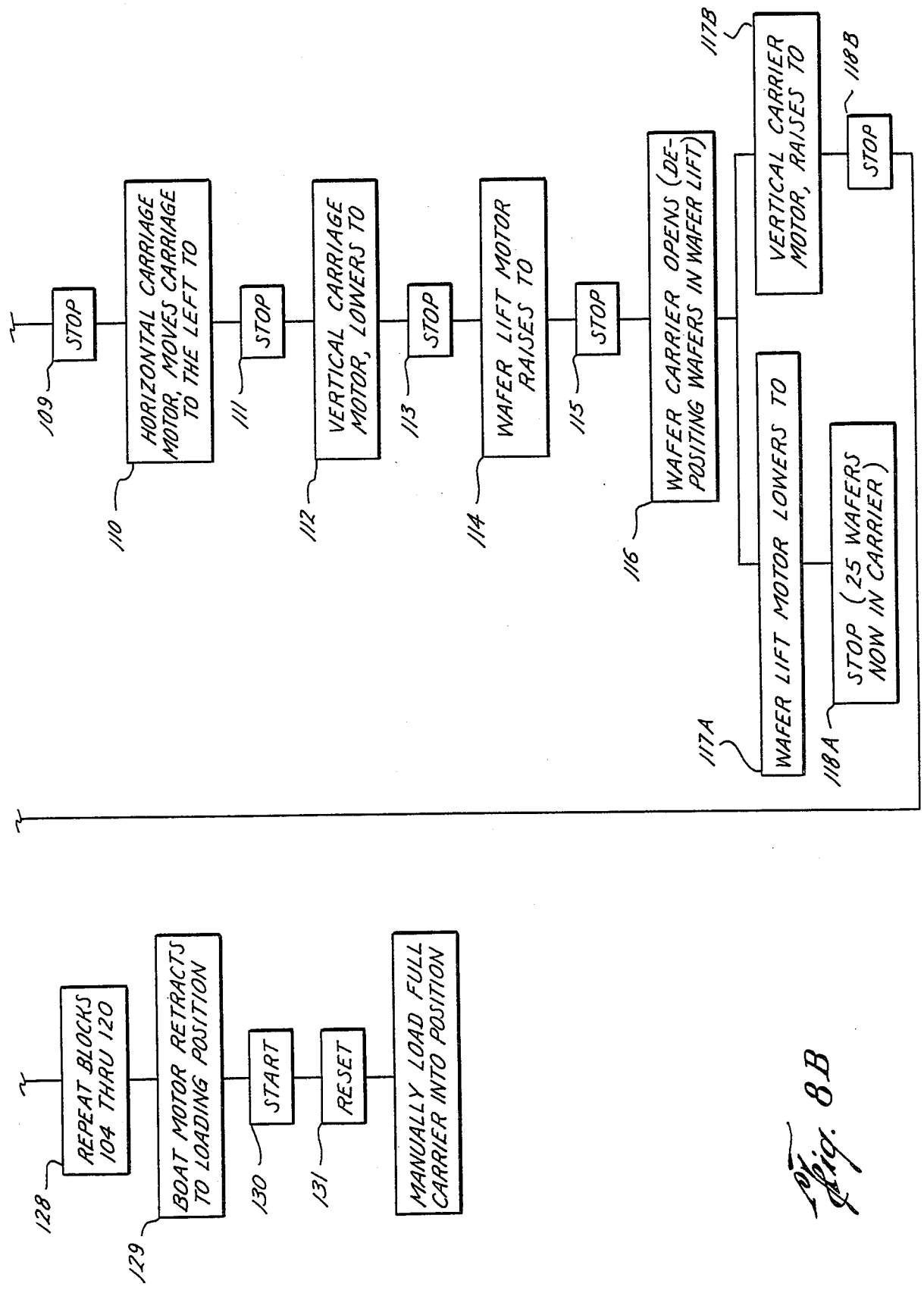

A schematic operating sequence is shown in FIGS. 8A and 8B. Preferably the operation of all of the various components of the system is carried out by electrical means, as this eliminates the necessity of pressures of different values and of different types of power being needed to operate the system.

Preferably, a standard microprocessor with associated electrical circuitry would be used to carry out the various steps. Basically, the system is connected such that as each of the functions are completed a signal is sent to the microprocessor to the effect that that function has been completed and the microprocessor in turn sends a signal to institute the next step in the system. The electrical circuitry to carry out these operations is standard and well known to those skilled in the art and the details of the system will not be given.

With the system in its neutral position, the travelling carriage is in the position shown in FIG. 1. At the completion of any transfer process the furnace boat carrier should be in its extended position for loading. If it is not, the system is preferably programmed so that upon turning the system on the furnace boat platform is extended to a position ready to be loaded with a furnace boat.

The furnace boat with wafers therein is manually loaded on to the furnace boat platform. A process carrier is placed in position on the platform 31-C4 in a position to actuate switch 34. In FIG. 8 the loading of the empty carrier into position operates the reset 99 in response to the switch 34 being operated which readies the system for the start cycle. At this time the start cycle is begun and approximately simultaneously the solenoids 25 and 26 are operated to separate the wafer carriers 23 and 24, as indicated at 102A. The boat motor 46-B31 advances the furnace boat platform to the unloading position, as indicated at 102b. When the boat strikes its stop the stall torque in the motor is increased, as indicated by the stop 103. This actuates the vertical carriage motor, as indicated at 104, to lower the carriage until it reaches its stop, as indicated at 105. At this time the wafer carrier is closed by release of the solenoids 25 and 26 to permit the spring 61-B2 to operate, as indicated at 106.

A timer function, as indicated at 107, may be interposed at this point to make certain that the wafer carrier is closed before carrying out any further operations. While not shown, dash pots may be provided to insure that the solenoids 25 and 26 are retracted slowly and easily by the force of spring 61-B2.

After the timing function is completed and, as indicated at 108, the vertical carriage motor 45-B3 is actuated to drive the carriage to its fully raised position where the stop, as indicated at 109, is actuated. The actuation of stop 109 institutes the horizontal carriage motor function, as indicated at 110, to move the carriage to the left in response to operation of the drive motor 46-B3.

The carriage moves to the left until it reaches its stop, as indicated by the stop function 111, which results in current being fed to the vertical carriage motor to lower the carriage, as indicated in 112, until it engages the stop 113. After the carriage has been moved to its stop position, as indicated at 113, the wafer lift motor 47-C5 is actuated, as indicated at 114, to raise the wafer support 18-D9 to its fully extended position in which it supports the several wafers from below in the slots in the wafer carriers 23 and 24. In the fully raised position the stop 115 is activated and this institutes the wafer carriage opening function 116 by energizing solenoids 25 and 26 to move the wafer carriers 23 and 24 to open position to release the wafers. As the wafers move to their full open position they institute two operations.

One is indicated at 117a in which the wafer lift motor 47-C5 lowers the wafer carrier to its full stop position, as indicated at 118a, in which the wafers are supported in the process carrier and the wafer lift carrier is in a fully out of the way position. At the same time, as indicated at 117b, the vertical carrier motor 45-B3 is operated to raise the carriage to its full stop position, as indicated at 118b. When the overload conditions are sensed in the motor a signal is generated, as indicated at 119, to activate the horizontal carriage motor 46-B3 and drive the carriage to the right to the position shown in FIG. 1 where the carriage again reaches a stop and the system has completed one cycle. If the operation is being carried out in the twenty-five cycle, the furnace boat platform now extends to its position to permit easy removal of the furnace boat and the cycle has been completed.

If the system is in the mode to transfer fifty wafers in two successive operations to two process carriers at this time the first cycle has been completed and as indicated at 121 the process carrier will be removed and replaced with an empty carrier. When the carrier is replaced, as indicated at 122, this operates switch 34 to condition the system for the second cycle. When operating the start button, as indicated at 123, the first action is that the solenoid 39 is operated, as indicated at 124 in FIG. 8, to release the boat solenoid. A timer is interposed in the system at this point, as indicated at 125, to give ample time for the arm 37 to swing to its second position. When this occurs the boat motor advances, as indicated at 126, to the second unload position by engaging stop surface 35. As the load on the motor 46-B31 was decreased as the furnace boat platform moved forward the striking of the stop would again overload the motor and a signal would be generated indicating that the furnace boat is in position. At this time the sequence of operations indicated above, beginning at 104 through 120, would be repeated to transfer the second group of wafers from the furnace boat to the process boat. As the system is now ready for a new furnace boat the boat motor 46-B31 would drive the furnace boat platform to extended position where it may be loaded with another furnace boat.

The system may be suitable programmed to additionally operate in the reverse mode and the operations explained above carried out in reverse order. In this instance a process boat would be manually loaded to again operate a switch 34, as indicated by the reset 131. Then operation of the start button 130 would carry out the operational sequences explained above in reverse order to transfer wafers from the process boat to the furnace boat. In this instance either a single cycle transferring twenty-five wafers may be carried out or the dual cycle transferring the contents of two process boats having twenty-five wafers each therein may be transferred to a single furnace boat containing fifty wafers.

As indicated earlier, the boats may not be completely full and the contents of the boat to whatever extent they have been loaded may be transferred between the process and furnace boats.

What is claimed is:

1. A transfer device for transferring a plurality of wafers between carriers comprising:
   a support for a first carrier,
   a support for a second carrier positioning the planes of the wafer grooves in the two carriers parallel to each other and on the same plane, a wafer support system having opposed wafer support means including alternate lands and grooves therein with said grooves being alternately provided with and without lower portions of reduced depth such that the alternate grooves having such lower portions engage and support wafers at their periphery below the horizontal centerline of the wafers while the side walls of the grooves above the lower portions maintain the wafer substantially vertical, means for moving said lower portions of reduced depth toward each other to support wafers therebetween and away from each other to release said wafers, and means for moving said wafer support system and carriers vertically and transversely relative to each other to transfer wafers on said wafer supports between carriers, said alternate grooves without said lower portions sized to pass over wafers in any position of the wafer support means.

2. The device of claim 1 wherein the lower portions of reduced depth have surfaces diverging upwardly and outwardly.

3. The device of claim 1 or 2 wherein means is associated with one of said supports and movable vertically relative thereto for supporting wafers and transferring them between wafer support means and a carrier associated with said one support.

4. The device of claim 1 or 2 wherein means is provided for indexing one of said wafer support systems and a selected one of said carrier supports to transfer a plurality of wafers to and from selected carriers at a second indexed position.

5. The device of claim 3 wherein means is provided for indexing one of said wafer support systems and a selected one of said carrier supports to transfer a plurality of wafers to and from selected carriers at a second indexed position.

6. A transfer device for wafers comprising:
a support for a carrier,
a wafer support system having opposed wafer support means including alternate lands and grooves therein with said grooves being alternately provided within and without lower portions of reduced depth such that the alternate grooves having such lower portions engage and support wafers at their periphery below the horizontal centerline of the wafers while the side walls of the grooves above the lower portions maintain the wafer substantially vertical,
means for moving said lower portions of reduced depths toward each other to support wafers therebetween and away from each other to release said wafers, and
means associated with said carrier support and movable vertical relative thereto for supporting wafers and transferring them between said wafer support system and a carrier associated with said carrier support,
said alternate grooves without said lower portions sized to pass over wafers in any position of the wafer support means.

7. A transfer device for transferring a plurality of wafers between carriers comprising:
a support for a carrier,
a wafer support system having opposed wafer support means including alternate lands and grooves therein with said grooves being alternately provided within and without lower portions of reduced depth such that the alternate grooves having such lower portions engage and support wafers at their periphery below the horizontal centerline of the wafers while the side walls of the grooves above the lower portions maintain the wafer substantially vertical,
means for moving said lower portions of reduced depths toward each other to support wafers therebetween and away from each other to release said wafers, and
means for moving said carrier support and wafer support system vertically away from each other to remove wafers from a carrier on the carrier support and toward each other to deposit wafers in a carrier on said carrier support,
said alternate grooves without said lower portions sized to pass over wafers in any position of the wafer support means.

8. The device of claim 7 wherein said lower portions of reduced depths have surfaces diverging upwardly and outwardly.

9. The device of claim 7 or 8 wherein transfer means is associated with said carrier support and movable vertical relative thereto for supporting wafers and transferring them between said wafer support system and a carrier on said carrier support.

10. The device of claim 7 or 8 wherein means is provided for indexing one of said wafer support system and said carrier support to transfer a plurality of wafers to or from a selected carrier at a second indexed position.

11. The device of claim 9 wherein means is provided for indexing one of said wafer support system and said carrier support to transfer a plurality of wafers to or from a selected carrier at a second indexed position.

* * * * *